United States Patent [19]

Hisada

[11] Patent Number: 5,130,744
[45] Date of Patent: Jul. 14, 1992

[54] IMAGE RECORDING APPARATUS CAPABLE OF MAINTAINING A CONSTANT TENSION IN A PHOTOSENSITIVE RECORDING MEDIUM

[75] Inventor: Hidenori Hisada, Tokoname, Japan

[73] Assignee: Brother Kogyo Kabushiki Kaisha, Nagoya, Japan

[21] Appl. No.: 673,457

[22] Filed: Mar. 22, 1991

[30] Foreign Application Priority Data

Aug. 16, 1990 [JP] Japan .................. 2-216607

[51] Int. Cl.⁵ .................. G03B 27/32; G03B 27/52
[52] U.S. Cl. .................. 355/27; 226/195
[58] Field of Search .......... 355/27, 50; 430/138; 226/195; 352/184

[56] References Cited

U.S. PATENT DOCUMENTS

| | | | |
|---|---|---|---|
| 4,399,209 | 8/1983 | Sanders et al. | 430/138 |
| 4,777,513 | 10/1988 | Nelson | 355/27 |
| 4,922,286 | 5/1990 | Tanabe | 355/27 |
| 4,939,535 | 7/1990 | Hashimoto et al. | 355/27 |
| 4,952,968 | 8/1990 | Ibuchi | 355/27 |
| 4,959,681 | 9/1990 | Ogura | 355/27 |
| 4,965,622 | 10/1990 | Ibuchi | 355/27 |
| 4,967,227 | 10/1990 | Suzuki et al. | 355/27 X |
| 5,028,952 | 7/1991 | Ibuchi | 355/27 |
| 5,060,008 | 10/1991 | Asai | 355/27 |
| 5,060,010 | 10/1991 | Ogura | 355/27 |
| 5,084,725 | 1/1992 | Ibuchi et al. | 355/27 |

FOREIGN PATENT DOCUMENTS

0350310A2 6/1989 European Pat. Off. .
62-143044 6/1987 Japan .

*Primary Examiner*—Richard A. Wintercorn
*Attorney, Agent, or Firm*—Oliff & Berridge

[57] ABSTRACT

An image recording apparatus for recording a latent image of an original color image onto an elongated web photosensitive recording medium by separating the color of the color image into a plurality of colors by creating a plurality of mask members, and exposing the same part of the photosensitive recording medium to each of the plural mask members by appropriately colored light. The tension applied to the photosensitive recording medium is detected by a sensor at a slack buffer location between an exposing unit and a developing unit when development of one latent image and exposure of a following latent image are carried out simultaneously. The driving speed for a motor for driving the buffer is changed by a control unit according to the tension of the photosensitive recording medium as detected by the sensor. Accordingly, when the driving speed of the buffer motor varies relative to speed of the developing unit causing a change in tension applied to the photosensitive recording medium during the simultaneous exposure and development operations, the driving speed of the buffer motor is adjusted by the control unit so that the tension of the photosensitive recording medium is maintained to be constant. Therefore, fluctuation in the tension of the photosensitive recording medium is prevented.

15 Claims, 5 Drawing Sheets

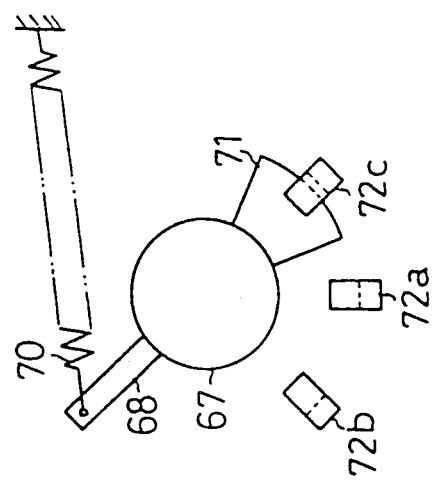
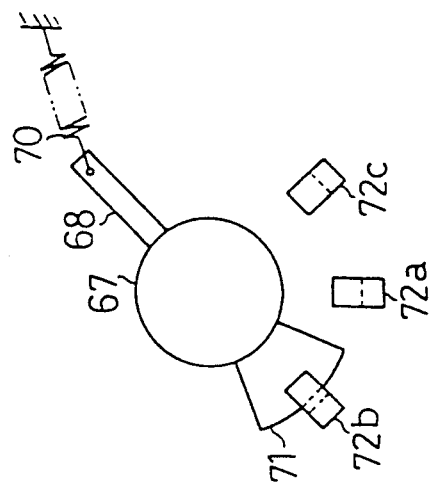
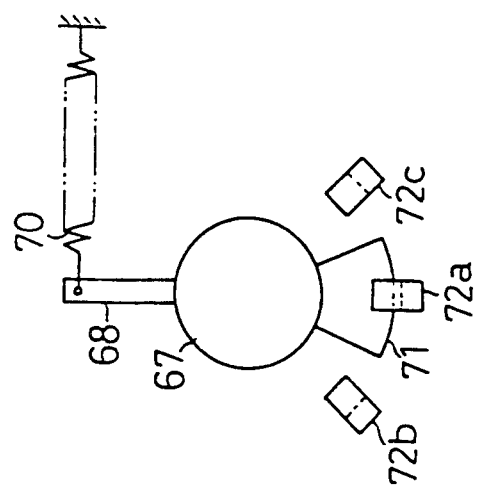

IMAGE RECORDING APPARATUS CAPABLE OF MAINTAINING A CONSTANT TENSION IN A PHOTOSENSITIVE RECORDING MEDIUM

BACKGROUND OF THE INVENTION

1. Field of the Invention

The present invention relates to an image forming apparatus for exposing a photosensitive medium to light by way of a mask member.

2. Description of Related Art

Image recording apparatuses pertinent to the present invention are disclosed in U.S. Patent Applications Ser. Nos. 07/611,501 and 07/611,837 filed on Nov. 13, 1990. Both are assigned to the same assignee as that in the present application.

In the disclosed image recording apparatuses, the color image to be recorded is first separated into three colors, and each of the different color images is recorded onto a medium such as plain paper or a transparent sheet. The recording of the color images onto the medium is done by a monochromatic laser printer. The plurality of media on which the different color images have been respectively recorded are called mask members. Thus, the original color image is broken down into a plurality of mask members. Normally, three mask members for R (red), G (green) and B (blue) are formed.

In the subsequent color image recording operation where a copy of the original copy image is recorded on the plain paper or transparent sheet, a first mask member is fed onto a glass plate by rotation of plural rollers. Then, an exposure table, located above the glass plate, is lowered to an exposure position so that a photosensitive recording medium stretched below the exposure table, and which has not yet been exposed to light, is brought into close contact with the first mask member. The photosensitive recording medium, a photosensitive sheet consisting of a base sheet with microcapsules on one surface, is held to the exposure table by means of a fastening roller to prevent slippage of the photosensitive recording medium.

Each of the microcapsules contains a photosensitive substance, having a viscosity that is sensitive to irradiated light, and a chromogenic material that reacts when exposed to a developer to produce a color agent or dye. As the construction of the microcapsules is described in detail in the specification of U.S. Pat. No. 4,399,209, any further explanation thereof will be omitted herein.

While the photosensitive recording medium is in close contact with the first mask member, the first mask member is irradiated by light from a light source located below the first mask member, that is, below the glass plate. The light is of the color that produced the mask, that is red light is used if the mask member is the red one. Accordingly, the photosensitive recording medium is exposed according to the image recorded on the first mask member and a latent image of the recorded image is recorded on the photosensitive recording medium. After the photosensitive recording medium is exposed to the light, the exposure table is lifted to a retracted position to separate the photosensitive recording medium from the first mask member and the first mask member is replaced with a second mask member. Subsequently, the exposure sequence is repeated for all remaining mask members. Thus, the image from each mask member is exposed at the same portion on the photosensitive recording medium. As a result, a latent image of the original color image is recorded onto the photosensitive recording medium. The latent image on the photosensitive recording medium is then developed by developing means.

Since the recording medium is an elongated web drawn from a roll and taken up by a reel, it is necessary to absorb the change in path length of the photosensitive recording medium, associated with the vertical movement of the exposure table, a means for applying a tension to the photosensitive recording medium is provided in the image recording apparatus.

Further, in order to simultaneously carry out the exposure of the photosensitive recording medium by the exposing means and the development of the photosensitive recording medium after the exposure by the developing means, between the exposing means and the developing means of the image recording apparatuses there is a buffer means for temporarily storing an exposed part of the photosensitive recording medium. FIG. 5 shows the tension applying means and the buffer means provided in these conventional image recording apparatuses.

Referring to FIG. 5, reference numeral 40 generally designates a buffer device consisting of the buffer means and the tension applying means. The area of a photosensitive recording medium 38 in which a latent image of the color image has been formed by the exposure is temporarily stored in the buffer device 40. A pair of timing belts 65 are arranged in parallel to each other with each of the timing belts 65 wrapped around a pair of timing pulleys 66. A buffer roller 40a of the buffer device 40 is fixed at each of its ends to one of the timing belts 65. A step motor 67, or driving means, for driving the buffer device 40 is located on one side of the buffer device 40. A stator of the step motor 67 is rotatably supported to the apparatus frame or related structure and a rotor of the step motor 67 is fixed to the shaft of the timing pulley 66 on the one side of the buffer device 40.

An arm 68 projects from the stator of the step motor 67, and a free end portion of the arm 68 is opposed to a stopper 69. A spring 70, to apply tension, is connected between the apparatus frame and the arm 68, so as to resiliently rotate the stator of the step motor 67 in a clockwise direction, as viewed in FIG. 5, and thereby applying tension through the timing belts 65 and the buffer roller 40a to the photosensitive recording medium 38.

However, in these image recording apparatuses, the driving force applied to the buffer means is always constant. Therefore, when the exposure of the photosensitive recording medium 38 and the replacement of the mask member are carried out in association with the vertical movement of the exposure table, simultaneously with the development of a previously exposed portion of the photosensitive recording medium 38 wherein the previously exposed portion is drawn from the buffer means to the developing means, the driving speed of the step motor 67 for driving the buffer device 40 differs relative to the developing speed causing a fluctuation in the tension applied to the photosensitive recording medium 38.

SUMMARY OF THE INVENTION

The present invention is directed to addressing the above-identified problem in the conventional image recording apparatus. It is an object of the present invention to provide an image recording apparatus which can prevent the driving speed of a driving means for driving a buffer means from being varied relative to a developing speed, thereby reliably preventing a fluctuation in the tension applied to the photosensitive recording medium when the exposure of an unexposed part of the photosensitive recording medium and the development of an exposed part of another portion of the photosensitive recording medium are simultaneously carried out.

To attain the above object, there is provided in an image recording apparatus for using an elongated web photosensitive recording medium, exposing means for exposing the photosensitive recording medium to light to form a latent image on the photosensitive recording medium, developing means for developing the latent image formed on the photosensitive recording medium, buffer means for temporarily storing the photosensitive recording medium between the exposing means and the developing means, driving means for driving the buffer means, and tension applying means for applying a tension to the photosensitive recording medium between the exposing means and the developing means; an improvement comprising detecting means for detecting the tension applied to the photosensitive recording medium by the tension applying means, and control means for controlling a driving force of the driving means according to the tension applied to the photosensitive recording medium detected by the detecting means.

In the image recording apparatus as constructed above, when a part of the photosensitive recording medium is being exposed by the exposing means and a part of the photosensitive recording medium is being developed, the tension applied to the photosensitive recording medium is detected by the detecting means. Then, a driving speed of the driving means for driving the buffer means is controlled by the control means according to the detected tension.

Accordingly, when the driving speed of the driving means for driving the buffer means varies relative to the developing speed to cause a change in the tension applied to the photosensitive recording medium by the tension applying means, the driving speed of the driving means is adjusted by the control means so that the tension of the photosensitive recording medium remains constant. The result is the fluctuation in the tension of the photosensitive recording medium is prevented.

BRIEF DESCRIPTION OF THE DRAWINGS

The above and other objects, features and advantages of the invention will become more apparent from reading the following description of the preferred embodiment taken in connection with the accompanying drawings in which:

FIGS. 3(a) to 3(c) are illustrations of the operation of detecting tension in a photosensitive recording medium;

DETAILED DESCRIPTION OF THE PREFERRED EMBODIMENTS

Hereinafter, an embodiment of the present invention will be described with reference to the drawings.

Figure 1:
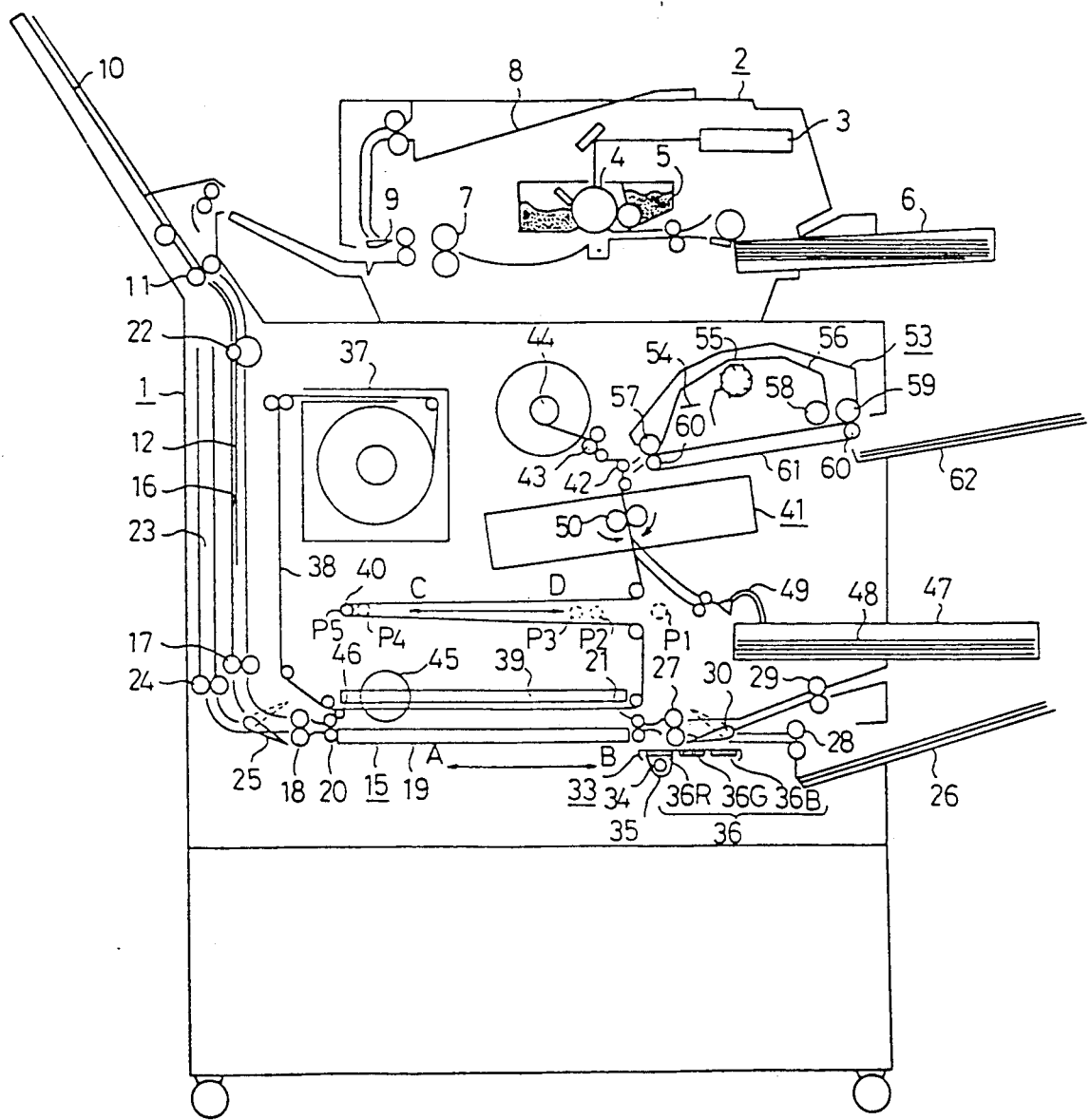
FIG. 1 shows an image recording apparatus according to an embodiment of the present invention.

FIG. 1 is a sectional view showing a monochromatic laser printer 2 and a color image recording apparatus 1 arranged in a coupled condition. The monochromatic laser printer 2 is placed on top of the color image recording apparatus 1.

In the laser printer 2, a laser beam is directed at an electrically charged photosensitive member or drum 4 by means of a polygon scanner 3 to form an electrostatic latent image on the photosensitive drum 4. The electrostatic latent image formed on the photosensitive drum 4 is then developed by a developing unit 5. A toner image formed by such development is transferred to a plain paper sheet or an overhead projector (transparent) sheet supplied from a sheet cassette 6. The toner image is then fixed to the sheet by a fixing unit 7. Normally, the monochromatic laser printer 2 records data transmitted from a host computer.

The sheet output from the laser printer 2 is directed into one of two routes by a sheet path selector 9. When a white/black image is required, the sheet is directed to a monochromatic discharge tray 8 or an automatic document feeder (hereinafter referred to as ADF) tray 10. When a color image is required, the sheet is directed first to the ADF tray 10 and then fed into the color image recording apparatus 1.

Sheets directed to the ADF tray 10 in this manner are then supplied, one by one, into the color image recording apparatus 1 by an ADF roller 11. A set of three such sheets, which have been output from the laser printer 2 and have monochromatic prints thereon constitute a set of mask members 12 (12R, 12G and 12B) for subsequent use in the color image recording apparatus 1. Each of the mask members 12 thus output normally has a curl toward the side on which the image is formed. Correction of this curl will be addressed during the description of the color image recording apparatus 1.

The color image recording apparatus has a positioning unit 15 disposed at a lower location in the body. A mask member transport path 16 extends from the ADF tray 10 to the positioning unit 15. Roller pairs 17, 18, 24, 27, 28 and 29, gates 25 and 30 for changing the mask member route, and a mask member accommodating section 23 are provided on the left and right sides, as shown in FIG. 1, of the positioning unit 15.

A recurler roller pair 22 for removing a curl of a mask member 12 output from the laser printer 2 is disposed intermediate of the mask member transport path 16.

A mask member discharge tray 26 for receiving a mask member 12 after use and discharged from the recording apparatus 1 is provided on the outer side of the roller pairs 28 and 29.

The positioning unit 15 includes a sensor (not shown) for aligning the mask member 12, the roller pairs 20 and 21 disposed adjacent left and right end portions of the positioning unit 15, and a glass plate 19 disposed between the roller pairs 20 and 21.

An exposure device 33 is disposed below the positioning unit 15 such that it is movable in leftward and rightward directions along the lower surface of positioning unit 15. Exposure device 33 comprises a linear white light source (hereinafter referred to only as lamp) 34, a reflecting member 35 for reflecting light from the lamp 34, and a filter unit 36 including a red filter 36R, a green filter 36G and a blue filter 36B.

A photosensitive recording medium 38 is composed of a web serving as a base material with a photosetting resin material and microcapsules applied to the web. The photosetting resin material contains, as a main material, a photopolymerization initiator as is known, for example, by Japanese Patent Laid-Open No. 143044/1987, and is hardened by light of the wavelengths for red, green and blue. The microcapsules individually contain dye precursors of cyan, magenta or yellow. The photosensitive recording medium 38 is mounted in a cartridge 37 so that it is not exposed to light. The photosensitive recording medium 38 is drawn from the cartridge 37 and first passes between the glass plate 19 and an exposure table 39. It is wound around a takeup roller 44 after passing a buffer 40, a pressure developing unit 41, a separating roller 42 and a drive roller 43.

When an exposure operation is to be performed by the exposure device 33, exposure table 39 is moved down by a cam 45 so that a mask member 12 which has been transported onto the glass plate 19 by the roller pair 20, is closely contacted with the photosensitive recording medium 38. Meanwhile, a fastening roller 46 is located adjacent a left end of the exposure table 39 so that, when the exposure table 39 is moved down to a predetermined position, the fastening roller 46 is pressed against a left end portion of the exposure table 39. As a result, while an exposure operation is taking place using one of the mask members 12R, 12G or 12B, the photosensitive recording medium 38 is held between and fixed by the exposure table 39 and fastening roller 46.

Color developer sheets 48, comprised of sheets having a color developer as disclosed, for example, in Japanese Patent Laid-Open No. 88739/1983, are set in the cassette 47 such that the face to which the color developer is applied is directed downwardly. The color developer sheets 48 are supplied to the pressure developing unit 41 one by one from the cassette 47 by a suction cup 49 which is intermittently driven by a driving source (not shown). The color developer sheet 48 is pressed by a pair of pressure rollers 50 of the pressure developing unit 41 while it is held in an overlapping relationship with the photosensitive recording medium 38 that has been exposed to light. Consequently, the latent image formed on the photosensitive recording medium 38 by the exposure operation is changed into a visible image on the color developer sheet 48.

Figure 5:
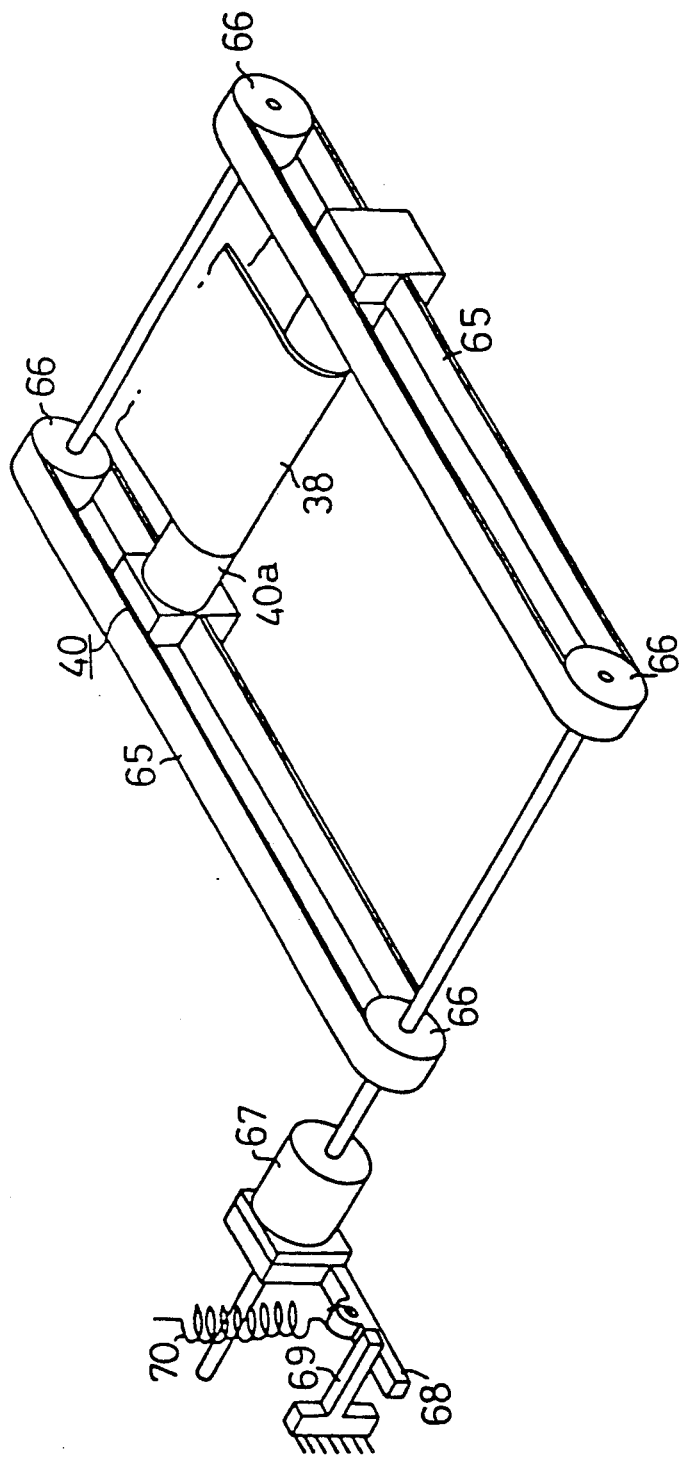
FIG. 5 is a perspective view of the buffer device in the related art.

A buffer device 40 constitutes the buffer means according to the present invention, and a latent image formed area of the photosensitive recording medium 38 in which the latent image has been formed by the exposure by the exposure device 33 is temporarily stored in the buffer device 40. In the buffer device 40, the same members as those in the conventional buffer device shown in FIG. 5 are designated by the same reference numerals. The pressure developing unit 41 constitutes the developing means according to the present invention, and it includes the pair of pressure rollers 50. The latent image formed area of the photosensitive recording medium 38 stored in the buffer device 40 and the developer sheet 48 supplied from the cassette 47 are overlapped with each other between the pressure rollers 50 in the pressure developing unit 41, so that the latent image is developed under pressure.

Comprising thermal fixing unit 53 are a casing 56 having a heater 54 and a vane wheel 55 located therein at upper locations, rubber rollers 57, 58 and 59 for the transportation of a color developer sheet 48 at a lower location, and an endless belt 61 extending between a pair of rollers 60 and 60.

The color developer sheet 48 fed from the pressure developing unit 41, and separated from the photosensitive recording medium 38 by the separating roller 42, is then glazed by the thermal fixing unit 53 and discharged to discharge tray 62.

Figure 2:
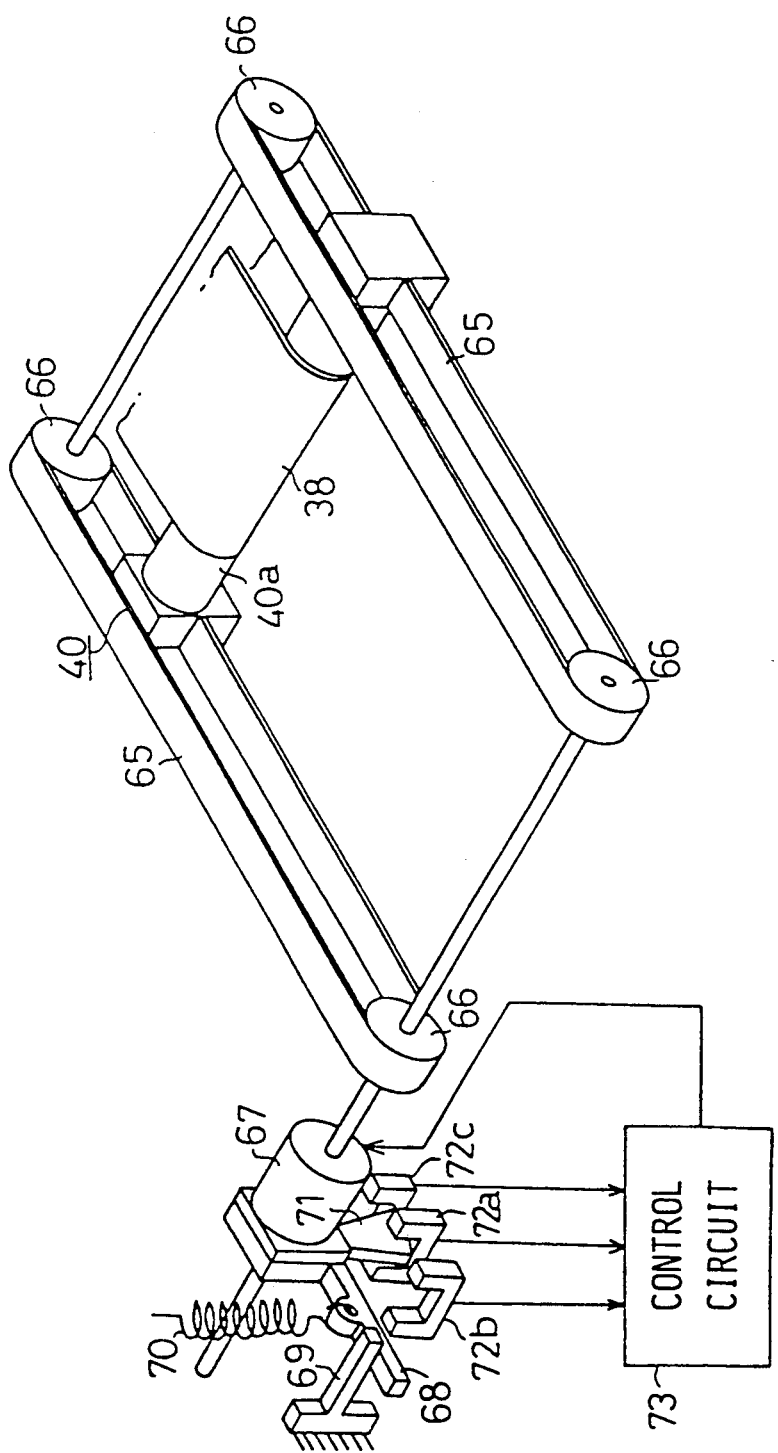
FIG. 2 is a perspective view of a buffer device according to the preferred embodiment.

The construction for driving the buffer device 40 and the construction for applying tension to the photosensitive recording medium 38 will be described with reference to FIG. 2. A pair of timing belts 65 are arranged in parallel to one another. Each of the timing belts 65 is wrapped around a pair of timing pulleys 66. A buffer roller 40a is fixed at each of its opposite ends to one of the timing belts 65. A step motor 67, as a driving means, for driving the buffer device 40 is located on one side of the buffer device 40. A stator of the step motor 67 is rotatably supported to a frame or other structure of the image recording apparatus and a rotor of the step motor 67 is fixed to the shaft of the timing pulley 66 on the one side of the buffer device 40.

An arm 68 projects from the stator of the step motor 67 and a free end portion of the arm 68 is opposed to a stopper 69. A spring 70, as the tension applying means, is connected between the apparatus frame and the arm 68, so as to resiliently rotate the stator of the step motor 67 in a clockwise direction, as viewed in FIG. 2, and thereby apply a tension through the timing belts 65 and the buffer roller 40a to the photosensitive recording medium 38.

A detection member 71 projects from the stator of the step motor 67. The detection member 71 is mounted to rotate with the stator and be opposed to one of first, second and third sensors 72a, 72b and 72c. That is, the detection member 71 takes a position opposed to one of the sensors 72a, 72b and 72c according to the rotational position of the stator of the step motor 67. Thus, the tension applied to the photosensitive recording medium 38 is detected by the sensor 72a, 72b or 72c opposed to the detection member 71 and a detection signal is output from the opposed sensor 72a, 72b or 72c to a control circuit 73. The control circuit 73 constitutes the control means according to the present invention, and controls the driving force of the step motor 67 according to the detection signal output from the opposed sensor 72a, 72b or 72c.

Operation of the image forming apparatus having the described structure for producing a plurality of color outputs from a set of mask members 12 will now be described.

First, a mask member 12R for red is produced by the monochromatic laser printer 2. The mask member 12R is a mask member which has toner at those points where all microcapsules containing dye precursors of yellow, cyan or magenta, are to remain unexposed or uncured and has clear areas to pass red light for curing or hardening the cyan microcapsules of the photosensitive recording medium 38. Subsequent actions to be described, using mask members 12G and 12B with filters for providing green and blue light through the clear portions of the mask member will cure or harden the magenta and yellow microcapsules respectively. In this instance, the mask member 12R output from the monochromatic laser printer 2 is sent to the ADF tray 10 and from there supplied to the color image forming apparatus 1 by the ADF roller 11.

Mask member 12R, fed into the color image recording apparatus 1, follows the mask member transport path 16 and is fed into the positioning unit 15 by the roller pairs 17 and 18. In this instance, the gate 25 is at the position indicated by solid lines. During such transport, the curled condition of the mask member 12R is corrected by the recurler roller 22.

Then, the positioning unit 15 transports the mask member 12R to the predetermined exposure position by the roller pair 20. Mask member 12R is accurately positioned by means of a driving source (not shown) using a positioning mark printed on the mask member 12R that is read by means of a sensor (not shown).

It is to be noted that immediately before such positioning is performed, the exposure table 39 is moved down to the predetermined position by the cam 45 until the left end portion thereof is contacted with the fastening roller 46 so that the photosensitive recording medium 38 is fixed to the exposure table 39.

At this time, the buffer device 40 is located at a position P3 where the photosensitive recording medium 38 is slightly drawn, as shown in FIG. 1. Under this condition, a driving roller 43 is fixed so as not to backwardly feed the photosensitive recording medium 38. Simultaneously, the step motor 67 shown in FIG. 2 is driven by the control circuit 73 so as to move the buffer device 40 from the position P3 in a direction as depicted by an arrow C in FIG. 1. As the photosensitive recording medium 38 is substantially fixed between the driving roller 43 and the exposure table 39, the buffer device 40 cannot move from the position P3 in the direction of the arrow C. However, the stator of the step motor 67 reacts to the driving force to rotate with the arm 68 and the detection member 71 against the biasing force of the spring 70. During the rotation of the stator, when the detection member 71 comes into opposition to the first sensor 72a, located centrally between the second sensor 72b and the third sensor 72c, a detection signal is output from the first sensor 72a and the rotation of the stator is stopped by the control circuit 73.

When the arm 68 is moved away from the stopper 69, a predetermined tension is applied to the photosensitive recording medium 38 by spring 70. The tension maintained on the photosensitive recording medium 38 is maintained preferably at a value of 1-2kgf in the case where the photosensitive recording medium 38 has a width of 223mm.

After completion of the positioning of the buffer device 40, the exposure table 39 is further moved down by cam 45 until it is in contact with the glass plate 19 of the positioning unit 15. In this position, the mask member 12R and the photosensitive recording medium 38 are in close contact with one another.

At this time, a change in path length of the photosensitive recording medium 38 in association with the lowering of the exposure table 39 is absorbed by moving the buffer device 40 from the position P3 to a position P2 shown in FIG. 1. In absorbing the change in path length of the photosensitive recording medium 38, the predetermined tension is maintained on the photosensitive recording medium 38 by the spring 70.

After the exposure table 39 is brought into close contact with the positioning unit 15, the lamp 34 is lit, with filter 36R in position over it, so that red light passes through the mask member 12R and irradiates the photosensitive recording medium 38. Since the first exposure device 33 performs a scanning exposure in the direction indicated by arrow A, the entire photosensitive recording medium 38 on the exposure table 39 is exposed to the light. After completion of the exposure, the lamp 34 is extinguished, and the first exposure device 33 is returned to its initial position in the direction indicated by arrow B. At this time, the filter unit 36 is rotated by a driving source (not shown) so that the green filter 36G is positioned above the lamp 34.

While the exposure device 33 is being returned to its initial position, the exposure table 39 is moved up by rotation of the cam 45 to space the photosensitive recording medium 38 away from the positioning unit 15 and mask member 12R.

At this time, slacking of the photosensitive recording medium 38 in association with the lifting of the exposure table 39 is absorbed by moving the buffer device 40 from the position P2 to the position P3. Also in absorbing the slacking of the photosensitive recording medium 38, a predetermined tension exerted by the spring 70 is applied to the photosensitive recording medium 38. Therefore, the photosensitive recording medium 38 can be moved away from the mask member 12R quickly and reliably.

Back tension is normally applied to the photosensitive recording medium 38, by means of a spring biased frictional coupling between the shaft supporting the photosensitive recording medium 38 and a part of the apparatus frame (not shown), from the center of rotation of the roll of the photosensitive recording medium 38 located in the cartridge 37. Accordingly, when the exposure table 39 is moved down, the photosensitive recording medium 38 is drawn from within the cartridge 37 by a length corresponding to the distance of downward movement of the exposure table 39, but when the exposure operation is completed and the exposure table 39 is moved up, the photosensitive recording medium 38 is rewound in a direction to take up any resulting slack.

After completion of the exposure by the mask member 12R for red, the exposure table 39 is moved up to the predetermined position by the cam 45. In this instance, since the fastening roller 46 remains in contact with the left end portion of the exposure table 39, the photosensitive recording medium 38 remains fixed with respect to the exposure table 39.

Subsequently, mask member 12G for green is produced by the monochromatic laser printer 2, and when the mask member 12G reaches a position directly forward of the roller pair 17 and past the ADF tray 10, ADF roller 11, recurler roller 22 and mask member transport path 16, the roller pairs 17, 18, 27 and 29 and the roller pairs 20 and 21 of the positioning unit 15 are rotated to transport the mask member 12R in the rightward direction to remove the mask member 12R from the positioning unit 15. Simultaneously, the mask member 12G is transported to and stopped at the exposure position. In this instance, the gates 25 and 30 are at the positions indicated by solid lines. Thus, the mask member 12R, after exposure, is clamped between the roller pair 29, and, after a trailing end of the mask member 12R passes the gate 30, rotation of the roller pair 29 is stopped. Consequently, the mask member 12R thereafter remains held by the roller pair 29.

The mask member 12G, introduced into the positioning unit 15, is positioned relative to the photosensitive recording medium 38 in the same manner as described for mask member 12R. Exposure table 39 is moved down to bring the mask member 12G into close contact with the glass plate 19 and the photosensitive recording medium 38. The lamp 34 is then lit to effect an exposure operation with green light by way of the green filter 36G. After completion of the exposure operation, the exposure table 39 is moved up to the predetermined position. The exposure device 33 is moved back to its initial position while the filter unit 36 is moved to position the blue filter 36B above the lamp 34.

Subsequently, a further mask member 12B for blue produced by the monochromatic laser printer 2 is fed into the color image recording apparatus 1 in the same manner as was the case for the mask members 12R and 12G. After the mask member 12B is transported to the position directly forward of the roller pair 17, the roller pairs 17, 18, 27 and 28 and the roller pairs 20 and 21 of the positioning unit 15 are rotated in a direction to transport the mask member 12G in the rightward direction.

Consequently, the mask member 12G is fed from the positioning unit 15 while simultaneously the mask member 12B is transported to and stopped at the exposure position. In this instance, the gate 25 is at the position indicated by solid lines while the gate 30 is at the position indicated by broken lines. The mask member 12G, after exposure, is clamped between the roller pair 28, and after a trailing end thereof passes the gate 30, rotation of the roller pair 28 is stopped and the mask member 12G remains in the thus clamped condition.

The mask member 12B introduced into the positioning unit 15 is subjected to a similar operation to effect close contact exposure of the photosensitive record medium 38 with blue light.

By the operations as described, a latent image of a desired color image is recorded on the photosensitive recording medium 38. Subsequently, the exposure table 39 is moved up to its initial position.

Thereafter, the exposure table 39 is lifted to the initial position by the cam 45, and the fastening roller 46 is moved away from the left end of the exposure table 39 to release the fixed condition of the photosensitive recording medium 38. At the same time, the buffer device 40 is moved toward a position P5 in the direction of the arrow C shown in FIG. 1, thereby drawing out an unexposed part of the photosensitive recording medium 38 from the cartridge 37 to the exposure position below the exposure table 39.

The drive roller 43 is activated and stopped when a leading end portion of the latent image on the photosensitive recording medium 38 comes to a position adjacent the pressure rollers 50 of the pressure developing unit 41.

A color developer sheet 48 is fed from within the cassette 47 by the suction cup 49 in synchronization with the movement of the photosensitive recording medium 38. The color developer sheet 48 is stopped at a position at which a leading end thereof corresponds to the leading end of the latent image of the photosensitive recording medium 38.

Then, the pressure rollers 50 of the pressure developing unit 41 are rotated in the direction indicated by the arrow by a known driving device (not shown) to press, under pressure, the color developer sheet 48 with that portion of the photosensitive recording medium 38 on which the latent image is formed.

The photosensitive recording medium 38 is then fed, under pressure and in contact with the color developer sheet 48 through developing unit 41. Consequently, those of the microcapsules on the photosensitive recording medium 38 which have not been hardened are ruptured by the pressure so that the color contained therein reacts with developer on the color developer sheet 48 and a color image corresponding to the latent image on the photosensitive recording medium 38 is developed on the color developer sheet 48.

Simultaneously, the exposure table 39 is moved down to the predetermined position until the left end thereof is in contact with the fastening roller 46 thereby fixing the photosensitive recording medium 38 to the exposure table 39.

In lowering the exposure table 39, a change in path length of the photosensitive recording medium 38 is absorbed by moving the buffer device 40 from the position P5 to the position P4.

Figure 4:
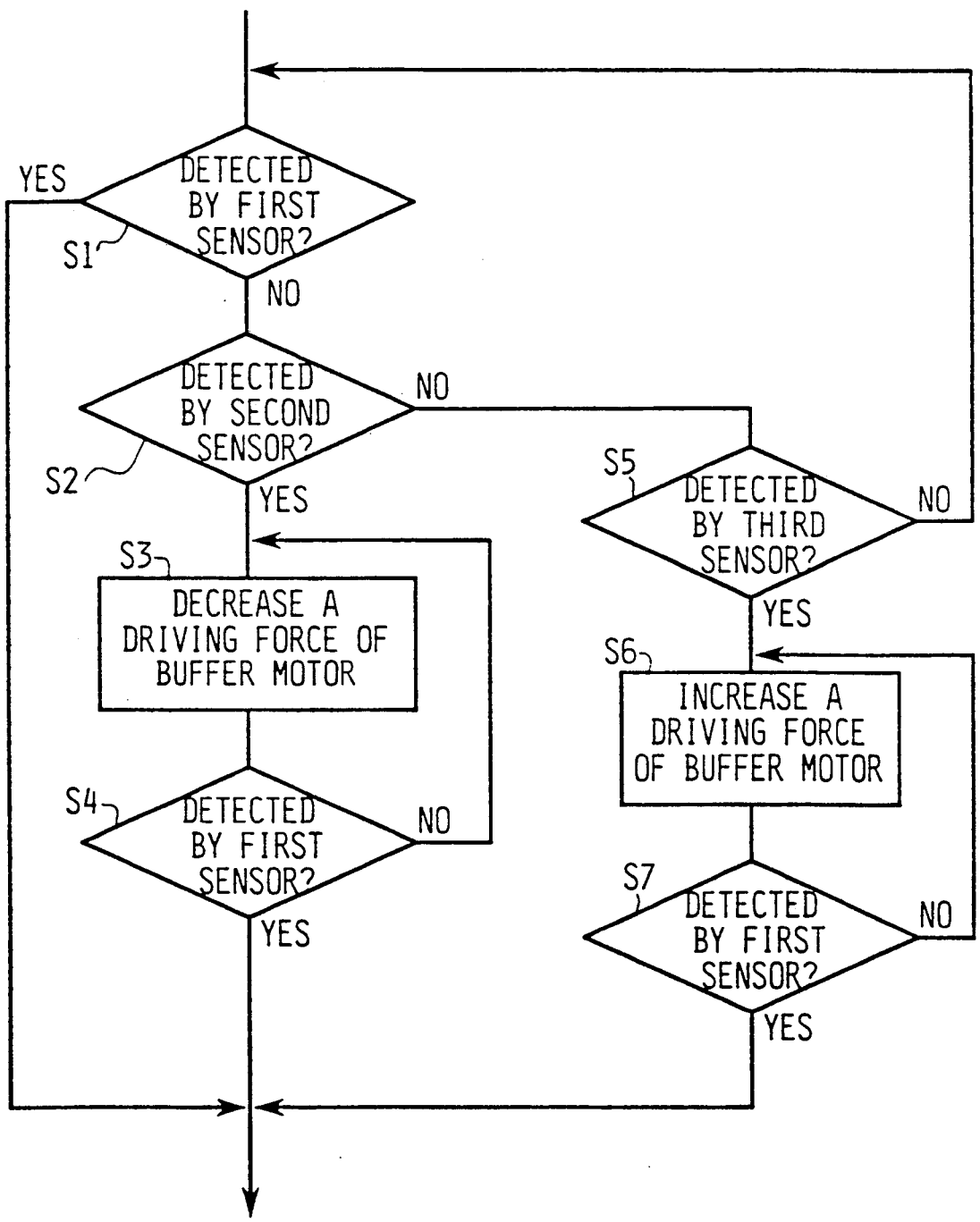
FIG. 4 is a flowchart showing of the detecting and control operations for maintaining the tension of the photosensitive recording medium.

In synchronism with the rotation of the pressure rollers 50 in the pressure developing unit 41, the buffer device 40 is moved from the position P4 to the position P1 in the direction of the arrow D shown in FIG. 1. At this time, as shown by the flowchart in FIG. 4, the rotational speed of the step motor 67 is changed by the control circuit 73 according to the detection signal from the sensor 72a, 72b or 72c, so that the tension applied to the photosensitive recording medium 38 by the spring 70 is maintained constant.

More specifically, when the tension of the photosensitive recording medium 38 is a predetermined value, the detection member 71 is opposed to the first sensor 72a as shown in FIG. 3(a), and a detection signal is output from the first sensor 72a to the control circuit 73 (step S1). In this case, the rotational speed of the step motor 67 is not changed and the tension of the photosensitive recording medium 38 is maintained at the predetermined value.

When the tension of the photosensitive recording medium 38 is weak, the detection member 71 is opposed to the second sensor 72b as shown in FIG. 3(b), and a detection signal is output from the second sensor 72b to the control circuit 73 (step S2). In this case, a control signal for decreasing the rotational speed of the step motor 67 is output from the control circuit 73 to the step motor 67. As a result, the spring 70 is gradually expanded to increase the tension to be applied to the photosensitive recording medium 38 because the photosensitive recording medium 38 is being drawn to the pressure developing unit 41 (step S3). Thereafter, when the tension of the photosensitive recording medium 38 reaches the predetermined value, the detection member 71 comes to opposition to the first sensor 72a, and the first sensor 72a generates a detection signal to the control circuit 73 (step S4). At this time, the decrease control of the rotational speed of the step motor 67 by the control circuit 73 is stopped based on the detection signal from the first sensor 72a.

In contrast, when the tension of the photosensitive recording medium 38 is strong, the detection member 71 is opposed to the third sensor 72c, as shown in FIG. 3(c), and a detection signal is output from the third sensor 72c to the control circuit 73 (step S5). In this case, a control signal for increasing the rotational speed of the step motor 67 is output from the control circuit 73 to the step motor 67. As a result, the spring 70 is gradually contracted to decrease the tension applied to the photosensitive recording medium 38 by the photosensitive recording medium 38 being drawn to the pressure developing unit 41 (step S6). Thereafter, when the tension of the photosensitive recording medium 38 reaches the predetermined value, the detection member 71 comes to a position opposite to the first sensor 72a, and the first sensor 72a generates a detection signal to the control circuit 73 (step S7). At this time, the increase control of the rotational speed of the step motor 67 by the control circuit 73 is stopped based on the detection signal from the first sensor 72a.

When the leading end of the color developer sheet 48 comes to the separating roller 42, the color developer sheet 48 is peeled away from the photosensitive recording medium 38 and guided toward the thermal fixing unit 53.

In the thermal fixing unit 53, the color developer sheet 48 is heated by air which is heated by the heater 54 and circulated in the casing 56 by the vane wheel 55, thereby promoting color development of the color image of the color developer sheet 48. Simultaneously, a binder polymer (binding resin), for fixing the color developing medium to base paper of the color developer sheet 48, is melted by heat, and consequently, the surface of the color developer sheet 48 becomes smooth and produces a suitable degree of gloss.

The color developer sheet 48, after completion of the color developing and glossing processing, is then discharged into the discharge tray 62.

During a series of the developing and glossing processing as mentioned above, an exposed part or portion of the photosensitive recording medium 38 is stored in the buffer device 40 under the condition where the photosensitive recording medium 38 is fixedly nipped by the exposure table 39 and the fastening roller 46. The change in path length of the photosensitive recording medium 38 in association with the lifting and the lowering of the exposure table 39 is absorbed by the movement of the buffer device 40. Accordingly, simultaneously with the developing and glossing processing for the latent image of the previously exposed color image, exposure processing to produce a next latent image of an original color image can be carried out at the exposure position.

When exposure for a second color image is to be performed using the previously used mask members 12, the mask member 12B at the exposure position is fed out in the leftward direction while the mask member 12R held at the position of the roller pair 29 is fed back into the positioning unit 15.

Accordingly, the roller pairs 17, 18, 27 and 29 and the roller pairs 20 and 21 of the positioning unit 15 are controlled to rotate to transport the mask member 12R in the leftward direction. In this instance, the gates 25 and 30 are at the positions indicated by solid lines in FIG. 1. The mask member 12B is held between the roller pair 17 and passes the gate 25, and when at a position at which a trailing end of mask member 12B has passed the gate 25, rotation of the roller pair 17 is stopped. Consequently, the mask member 12B is retained at that position by roller pair 17. Mask member 12R, fed into the positioning unit 15, is then positioned as described above, and the photosensitive recording medium 38 is exposed to red light when in close contact with the mask member 12R. Subsequently, the mask member 12R is fed out in the leftward direction from the exposure position while the mask member 12G, held by the roller pair 28, is fed into the positioning unit 15. In particular, the roller pairs 24, 18, 27 and 28 and the roller pairs 20 and 21 of the positioning unit 15 are rotated to transport the mask members 12R and 12G in the leftward direction. In this instance, the gates 25 and 30 are positioned at the positions indicated by broken lines. The mask member 12R is clamped between the roller pair 24, after a trailing end of mask member 12R passes the gate 25 rotation of the roller pair 24 is stopped and the mask member 12R is retained at that position. Mask member 12G, fed into the positioning unit 15, is positioned and then photosensitive recording medium 38 is exposed to green light while in close contact with the mask member 12G. Subsequently, the mask member 12G is fed out in the rightward direction from the exposure position, and then a similar operation is performed to feed the mask member 12B held at the position of the roller pair 17 into the positioning unit 15 in place of the mask member 12G and the photosensitive recording medium 38 is exposed to blue light while in close contact with mask member 12B. As a result, the latent image of the color image is formed on the photosensitive recording medium 38 and the color image is subsequently formed on a color developer sheet 48 as described above. By repeating a similar sequence of operations, a desired number of color images can be produced from a single set of mask members 12.

After the required number of color images have been produced from the same mask members 12, the mask members 12 are discharged into the discharge tray 26 from the roller pair 29 or roller pair 28.

On the other hand, in the case where a second set of mask members 12 are output from the monochromatic laser printer 2 while exposure processing of a series of color images from the first set of mask members 12 is proceeding, the second set of mask members are stored in the ADR tray 10. Then, the stored mask members 12 are subsequently fed one by one into the color image recording apparatus 1 by the ADF roller 11 after completion of an exposure operation for the preceding set of mask members.

Further, in the case of a set of mask members 12 produced from another monochromatic laser printer or a set of mask members 12 which have been used previously and are to be used again, manual insertion of the mask members 12 into the ADF tray 10 is possible.

It is to be understood that the present invention is not limited to the construction of the above preferred embodiment, but the construction of each element such as the buffer means, the buffer driving means and the tension applying means in the present invention can be arbitrarily modified without departing from the spirit and scope of the present invention.

As described above, the present invention has the advantage that the operating speed of the buffer means can be varied thereby reliably preventing a fluctuation of a tension applied to the photosensitive recording medium when the exposure of an unexposed part of the photosensitive recording medium and the development of an exposed part of the photosensitive recording medium are carried out simultaneously.

What is claimed is:

1. An image recording apparatus for recording a latent image of an elongated web photosensitive recording medium comprising:
   an exposing means for exposing a part of the photosensitive recording medium to light to form a latent image thereon;
   a developing means for developing the latent image formed on said part of the photosensitive medium after being exposed;
   a buffer means for temporarily storing a portion of said photosensitive recording medium between said exposing means and said developing means;
   a driving means for driving said buffer means;
   a tension applying means for applying a tension to said portion of said photosensitive recording medium between said exposing means and said developing means;

a detecting means for detecting tension applied to said photosensitive recording medium by said tension applying means; and a control means for controlling a driving force of said driving means according to the tension of said photosensitive recording medium detected by said detecting means.

2. An image recording apparatus according to claim 1, wherein said driving means is a step motor, said step motor having a stator and a rotor.

3. An image recording apparatus according to claim 2, wherein said stator is swingably supported on a fixed part of the image recording apparatus and said detecting means comprises:

a detection member projecting from the stator of said step motor; and a plurality of sensors for detecting the position of said detection member.

4. An image recording apparatus according to claim 3, wherein said plurality of sensors comprises three sensors.

5. An image recording apparatus according to claim 1, wherein said tension applying means is a spring.

6. An image recording apparatus having means for separating a colored image into a plurality of colors, means for producing a plurality of mask members, one mask member for each of the plurality of colors, means for recording a latent image of the color image onto a elongated web photosensitive recording medium using the plural mask members, and means for developing the latent image recorded on the photosensitive recording medium, said image recording apparatus comprising:

a fastening means for fastening a part of the photosensitive recording medium at an exposure position;

a contacting means for making the part of the photosensitive recording medium fastened by said fastening means closely contact one of the plurality of mask members;

an exposing means for exposing the part of the photosensitive recording medium to light through the mask member while the photosensitive recording medium is maintained in close contact with the mask member by said contacting means so that the latent image corresponding to the image recorded on the mask member is formed onto the part of the photosensitive recording medium;

developing means for developing the latent image formed on the part of the photosensitive recording medium after exposure;

a buffer means for temporarily storing a portion of the photosensitive recording medium between said exposing means and said developing means;

a driving means for driving said buffer means to change a length of the photosensitive recording medium stored in said buffer means;

a tension applying means for applying a tension to the portion of the photosensitive recording medium between said exposing means and said developing means;

a detecting means for detecting the tension applied to said photosensitive recording medium by the tension applying means; and a control means for controlling a driving force of said driving means according to the tension of the photosensitive recording medium detected by said detecting means.

7. An image recording apparatus according to claim 6, wherein said driving means is a step motor having a stator and a rotor.

8. An image recording apparatus according to claim 7, wherein said stator is swingably supported on a fixed part of the image recording apparatus and said detecting means comprises:

a detection member projecting from the stator of said step motor; and a plurality of sensors for detecting the position of said detection member.

9. An image recording apparatus according to claim 8, wherein said plurality of sensors comprises three sensors.

10. An image recording apparatus according to claim 6, wherein said tension applying means is a spring.

11. A tension control system used in an image recording apparatus employing an elongated web photosensitive recording medium, comprising:

a buffer means for temporarily storing a portion of said photosensitive recording medium;

a driving means for driving said buffer means;

a tension applying means for applying a tension to the photosensitive recording medium;

a detecting means for detecting the tension applied to the photosensitive recording medium by said tension applying means; and a control means for controlling a driving force of said driving means according to the tension of the photosensitive recording medium detected by said detecting means.

12. A tension control system according to claim 11, wherein said driving means is a step motor having a stator and a rotor.

13. A tension control system according to claim 12, wherein said stator is swingably supported on a fixed part of the image recording apparatus and said detecting means comprises:

a detection member projecting from the stator of said step motor; and a plurality of sensors for detecting the position of said detection member.

14. A tension control system according to claim 13, wherein said plurality of sensor comprises three sensors.

15. A tension control system according to claim 11, wherein said tension applying means is a spring.

* * * * *